United States Patent
Tenten et al.

(10) Patent No.: US 7,478,369 B2
(45) Date of Patent: Jan. 13, 2009

(54) METHOD AND DEVICE FOR OPTIMISING A TEST PROGRAMME

(75) Inventors: Wilfried Tenten, Gammertingen (DE); Heiko Beyer, Erlangen (DE); Waltraud Hartl, Latschenweg (DE)

(73) Assignee: Robert Bosch GmbH, Stuttgart (DE)

( * ) Notice: Subject to any disclaimer, the term of this patent is extended or adjusted under 35 U.S.C. 154(b) by 591 days.

(21) Appl. No.: 10/311,949

(22) PCT Filed: Jun. 9, 2001

(86) PCT No.: PCT/DE01/02161

§ 371 (c)(1),
(2), (4) Date: Aug. 12, 2003

(87) PCT Pub. No.: WO01/98901

PCT Pub. Date: Dec. 27, 2001

(65) Prior Publication Data

US 2004/0100468 A1 May 27, 2004

(30) Foreign Application Priority Data

Jun. 20, 2000 (DE) .................................. 100 29 346

(51) Int. Cl.
*G06F 9/44* (2006.01)
*G06F 9/45* (2006.01)

(52) U.S. Cl. .................. 717/125; 717/132; 717/141; 717/144; 714/38; 714/39

(58) Field of Classification Search ........................ None
See application file for complete search history.

(56) References Cited

U.S. PATENT DOCUMENTS

| 4,860,204 A | * | 8/1989 | Gendron et al. ............. 717/109 |
| 4,894,829 A | | 1/1990 | Monie et al. |
| 5,157,779 A | * | 10/1992 | Washburn et al. ............. 714/37 |
| 5,774,725 A | * | 6/1998 | Yadav et al. ................. 717/135 |
| 6,002,871 A | * | 12/1999 | Duggan et al. ............... 717/135 |
| 6,421,822 B1 | * | 7/2002 | Pavela ......................... 717/125 |
| 6,671,869 B2 | * | 12/2003 | Davidson et al. ............. 716/17 |
| 6,748,583 B2 | * | 6/2004 | Aizenbud-Reshef et al. 717/127 |

FOREIGN PATENT DOCUMENTS

WO          WO 99/47937          9/1999

OTHER PUBLICATIONS

Masciola, J.A. et al., "A Software Architecture for Mixed Signal Functional Testing", Proceedings of the International Test Conference, Washington, Oct. 2-6, 1994, New York, IEEE, US, pp. 580-586.

* cited by examiner

*Primary Examiner*—Chuck O Kendall
(74) *Attorney, Agent, or Firm*—Kenyon & Kenyon LLP

(57) ABSTRACT

A method of supporting the optimization of a test program that is made up of a plurality of actions is described. The method may include applying the test program to a device, recording a protocol having a plurality of entries, each corresponding to an action and each specifying at least the type and the time the action is performed, outputting a graphic representation of the sequence of the actions derived from the protocol highlighting at least one selected type of action performed during the application of the test program.

8 Claims, 3 Drawing Sheets

METHOD AND DEVICE FOR OPTIMISING A TEST PROGRAMME

FIELD OF THE INVENTION

The present invention relates to a method and a device to support a user in optimizing a test program.

BACKGROUND INFORMATION

The development or optimization of complex electronic devices or circuits requires extensive tests, signals of a test system being input into a test object and the agreements or deviations of the behavior of the test object thus caused from an expected behavior being analyzed. The test systems used for this purpose may be understood to be a set of instruments whose actions are controlled by a test program. In this context, the term "instrument" is understood in a very broad sense. Accordingly, an instrument may be understood to be both an individual signal generator or a single measuring instrument as well as a group of signal generators or measuring instruments, which interact under the control of a control unit in order to simulate a concrete application situation of an object to be tested via supplied signals or to analyze the interaction over time of several response signals picked off at the test object.

Test programs are made up of instruction sequences similar to a computer program that define the actions of the individual instruments. These instruction sequences are generally written by hand. It is often not only desirable to optimize them with respect to time by accelerating the test process, but it is sometimes absolutely necessary in order to provide a sequence of signals on time in order to test the test object in a given time-critical application situation and to be able to analyze the response of the test object to these signals.

Such an optimization requires much subject knowledge and programming time. Tools that make it possible to reduce this expenditure of time and to systematize the optimization have not been available until this time.

SUMMARY

This gap is filled by the method of the present invention and the device for implementing it.

In applying the test program to a device, the example method of the present invention provides for recording a protocol having a plurality of entries, each of which corresponds to an action performed by the test program, each entry specifying at least the type and the time of implementation of the action. Subsequently, a graphic representation of the sequence of the actions is derived from this protocol, at least one type of action selected by a user from among the actions performed during application of the test program being highlighted in the graphic representation.

In this manner, the user obtains an overview of the frequency and time distribution of the selected action in the shortest time possible, or by selecting various actions, of the actions executed by the test program in general. The optimization steps that may be taken while being aware of this time distribution vary according to the type of actions highlighted. If the highlighted actions represent, for example, a waiting condition of an instrument, a programmer may, using the existing graphic representation, attempt to fill in such waiting times with actions to be performed by other instruments. If the operations are intended to connect an instrument to a signal input or output point of the test object, an attempt may be made to exchange the sequence of the performance of individual actions in such a way that several measuring operations may be performed at the signal input/output point without an intervening interruption of the connection, thus minimizing the time loss associated with establishing and interrupting a connection.

According to an example embodiment of the present invention, the test program has a hierarchical structure, which means that it is made up of a sequence of first order actions, which in turn may be made up of higher order actions, and each action is either an elementary action which cannot be broken down further or it is made up of several actions of a next higher order.

Such a hierarchical structuring not only makes it easier to write and maintain a test program, but also to derive the graphic representation. This allows a user to select an order so that the graphic representation only contains actions of this order and preferably also of the lower order or orders. The order selected by the user need not necessarily be the same as the order of the action that was selected for highlighting. If these orders are different, the occurrence of the selected action is pointed out to the user by highlighting the actions that include an action of the selected type among the actions displayed.

A display on a screen is a form of representation that is flexible in particular.

For example, it makes it possible for the user to generate an additional graphic representation of those actions (of lower order) from which the selected action is made up in response to the selection of an action displayed in the graphic representation.

Moreover, it allows the use of a graphic pointing device such as a mouse or a trackball to select the actions to be displayed in detail.

According to an example embodiment, a reference to a position of the test program corresponding to the logged action is recorded in each protocol entry. This makes it possible, for example, for a user to insert a marker directly into the code of the test program by selecting an action in the graphic representation in order to edit the test program later at the marked location, or to jump directly to the position of the test program corresponding to the marked action in a program editor.

Additional features and advantages of the present invention are derived from the following description of exemplary embodiments with reference to the appended figures.

DETAILED DESCRIPTION

Figure 1:
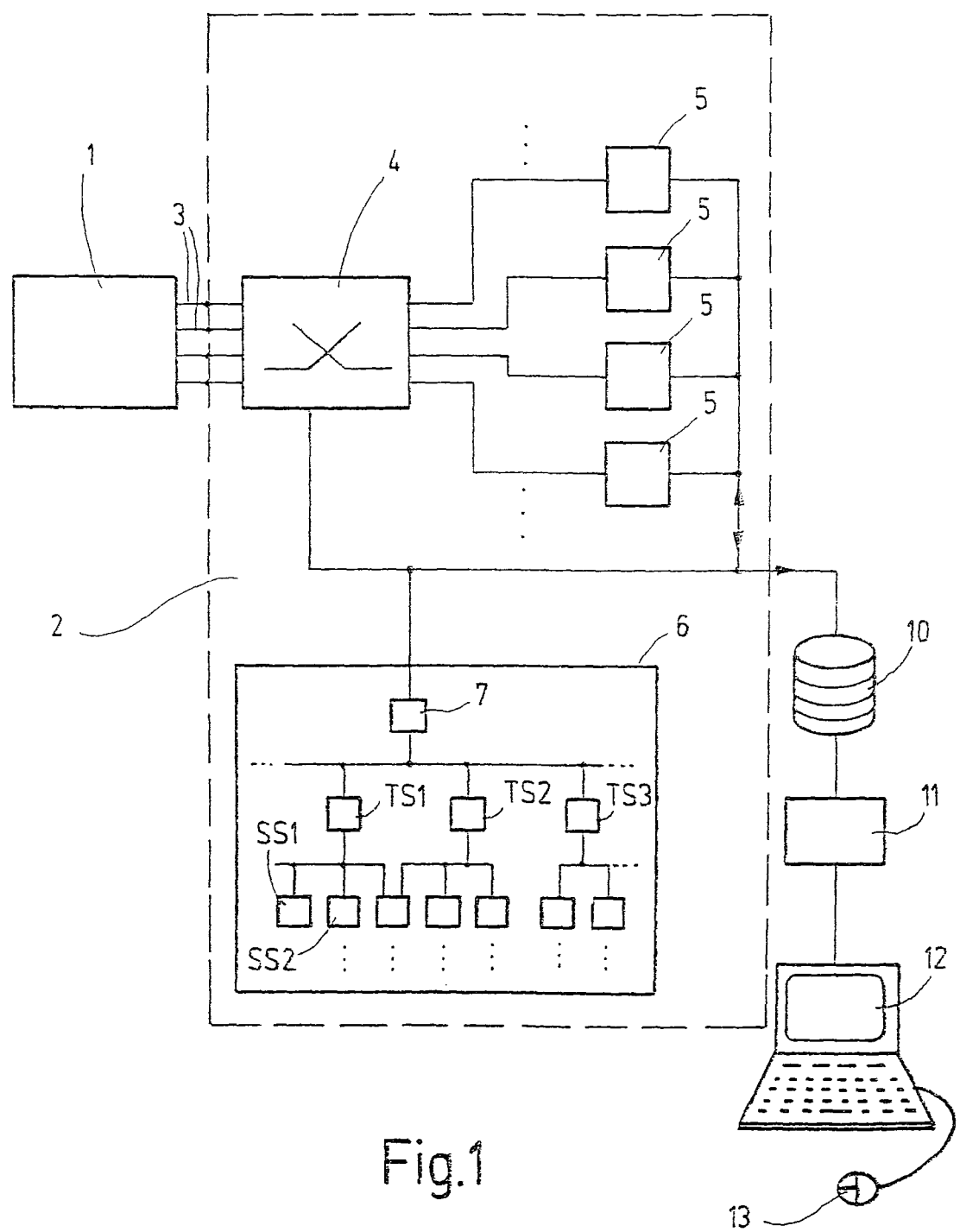
FIG. 1 shows a schematic block diagram of a device according to an example embodiment of the present invention to support the optimization of a test program.

FIG. 1 shows a test system including a device according to an example embodiment of the present invention to support the optimization. In this idealized representation, 1 denotes a device to be tested. A device for the purposes of this description may be in particular a complete module, an electric circuit, an integrated circuit in particular. Several terminals 3 of the tester are connected to different points in the circuit of device 1 in order to feed signals from the tester into device 1 and to pick off the response of device 1 to these signals.

Within tester 2, terminals 3 may be selectively connected to a plurality of signal generator and measuring units 5 via a network matrix or a switching matrix 4. The establishment of the connections via switching matrix 4, the signal generation and recording of measured values by signal generator and measuring units 5 is controlled by a control unit 6 which processes a test program. The structure of the test program is shown symbolically in the figure: Test program 7 is made up of a plurality of first order actions $8_1, 8_2, \ldots$, which are called by test program 7 in succession. These first order actions may be, for example, subprograms or macro programs, each of which has the objective of checking the operability of an individual module of device 1 or the capability of the device to perform a specific task.

In the simplest case, the application of a single test signal at a point of device 1 and the query of a response of the device to it may be sufficient for such a check. In such a case, the first order action may be made up of a plurality of elementary actions that cannot be further broken down such as, for example, a command to a signal generator to generate a specified signal level, a command to switching matrix 4 to connect the addressed signal generator to a given point of device 1 and to connect an additional signal generator and measuring unit to a different point of the device where the response to the test signal is to be picked off, with intercalated waiting conditions if necessary, which take into account the time needed by the signal generator to adjust the specified signal level and/or by device 1 to generate the response signal.

In many practical applications, however, the check of operability of the device may require more complex actions such as the application of several signals simultaneously to different points of device 1 or to one point in succession as well as the measurement at one or more points simultaneously or in succession and the performance of logical operations between the obtained measured values. Such first order actions may in turn be broken down into simpler second order actions $9_1, 9_2, \ldots$, etc., which in turn, may be elementary or capable of being broken down further.

To implement the example method of the present invention, a mass storage 10, which is connected to a bus connecting control unit 6 to the control inputs of switching matrix 4 and signal generator and measuring units 5, records the starting and end points of execution, a starting address of the code of the action in the test program and, if necessary, a response of switching matrix 4 or of signal generator and measuring units 5 for all actions TS1, TS2, . . . , SS1, SS2, . . . etc. executed by control unit 6. Preferably, parameters used to call an action are also recorded.

To implement the example method of the present invention, a device 1 may be advantageously used which has already been tested and of which it is known that it responds to the signals delivered by test 2 in the desired manner. As an alternative to this, device 1 may be simulated with the aid of a computer. In this manner, it is ensured that the protocol recorded in mass storage 10 is representative of a correctly functioning device and that an optimization of the test program performed using the protocol actually results in time savings when testing a device that operates at least "mostly error-free." Of course, however, a defective device 1 may also be used to generate the protocol, in particular when the optimization of the test program is to be used to check an error of this device in greater detail.

A processor 11 is used to convert the protocol recorded in mass storage 10 into a graphic representation that is then displayed on a display terminal 12 for more exact analysis by an operator. Of course, processor 11 and display terminal 12 and, if necessary, mass storage 10 may be combined in a single apparatus such as a PC. A pointing device 13 to point to screen areas of display terminal 12 is connected to the display terminal.

Figure 3:
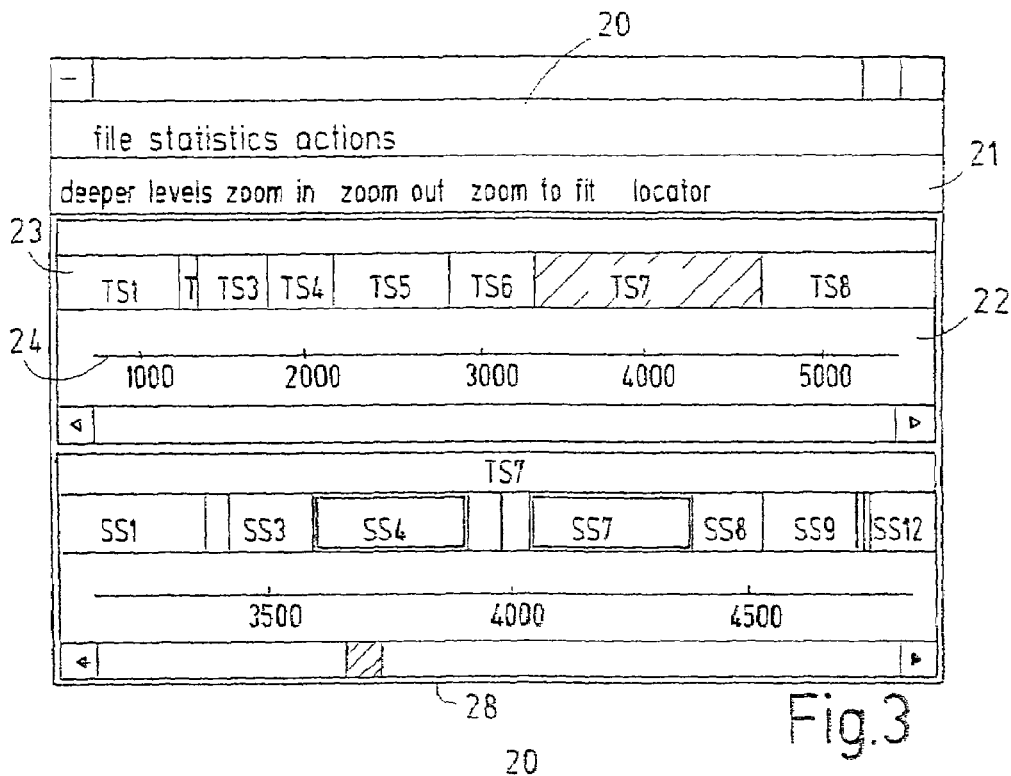
FIG. 3 shows an exemplary view of a graphic representation generated according to an example embodiment of the present invention.

FIG. 3 shows a typical graphic representation produced by processor 11. The graphic representation is modeled after the appearance of a window in Microsoft Windows. Its first line 20 includes several drop-down menus that allow a user to open a file having a test protocol, have specific statistical tests performed on the data of the protocol, or select individual actions, the occurrence of which is to be highlighted in the graphic representation.

To determine the identity of a selected action with an action entered in the protocol, the address entered in the protocol and/or the parameters of the action are used. It is thus possible to use the address to identify any action intended to adjust an output signal of a signal generator and measuring unit 5 to the object. The additional use of the parameters makes it possible to identify actions that relate to only one specific signal generator and measuring unit or it is possible to identify actions for adjusting an output signal of a specified form for all signal generator and measuring units.

The statistical tests include, for example, a test of the frequency of execution of individual actions. Such an analysis quickly informs the user of the operations for which time optimization is most worthwhile for achieving acceleration of the test program. Moreover, it is possible to perform tests of the rate of utilization of the switching matrix over time or of individual signal generator and measuring units. A high rate of utilization of the switching matrix may, for example, indicate that it might be desirable to change the chronological sequence of individual actions in such a way that it is possible to reduce the duration of individual connections in order to gain connection capacity for other actions that may then be performed with a time overlap. The test of the rate of utilization of individual signal generator and measuring units may provide information whether it might be practical to transfer actions from heavily utilized signal generator and measuring units to ones that are less utilized.

Line 21 shows a number of commands that refer to the type of graphic representation of the protocol and make it possible to adapt the time scale used for the graphic representation to the wishes of the user.

A first subwindow 22 shows the chronological sequence of the first order actions, also denoted as test steps, of a test program. The individual test steps are displayed as boxes 23 which are labeled TS1 to TS8 corresponding to the eight steps of the test program used here as an example and which are plotted on a time scale 24 with a length corresponding to their duration.

By clicking a box 23 with mouse 13, the user is able to select one of the test steps. The selected box, in this case the box labeled TS7, is then highlighted in the display, which is identified by hatching in FIG. 3 and an additional subwindow 25 is then opened which displays the sequence of second order actions SS1, . . . SS12 in selected test step TS7 in a manner analogous to subwindow 22. The individual second order actions are displayed by boxes 26, each having a length on a time scale 27 corresponding to its duration. A scroll bar 28 makes it possible to shift the segment of the test program displayed in window 25 beyond the limits of test step TS7 presently displayed.

The occurrence of a selected action, for example, the establishment of a connection between a specific signal generator and measuring unit 5 and a specific terminal 3, is recognizable in subwindow 25 by graphically highlighting those second order operations that include the relevant action. In the example shown here, highlighting is accomplished by drawing the second order actions including the selected actions, actions SS4 and SS7 in this case, with a bold frame. The display makes it distinctly clear that the same connection is established twice within a short time interval and thus provides the user information that it might be appropriate to check if it is possible to maintain the connection in the meantime or if the interim disconnection may be made superfluous through a possible reversal of the chronological sequence of actions.

Figure 4:
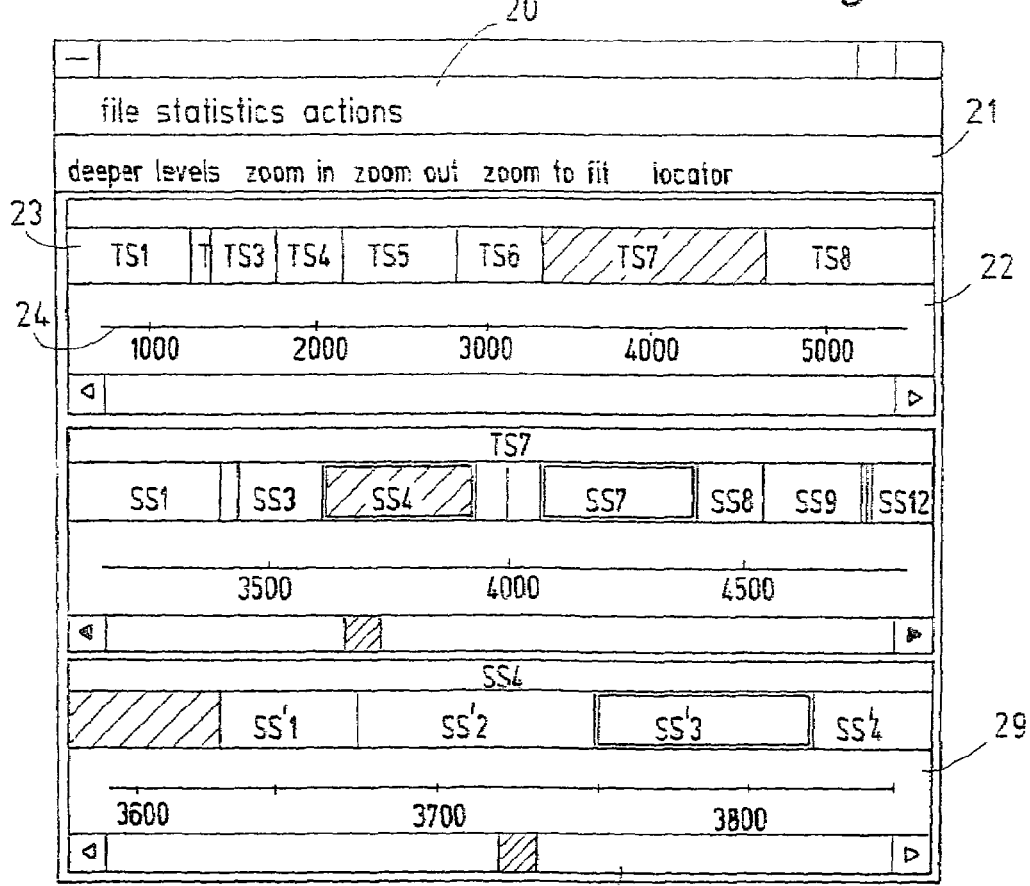
FIG. 4 shows a second graphic representation.

If the user selects a second order action, for example, action SS1 in subwindow 25 using mouse 13, it is highlighted in a manner corresponding to test step 7 before (see FIG. 4) and an additional subwindow 29 is opened which displays the sequence of third order actions SS'1, SS'2, . . . in the selected second order action. In this case also, the third order action which includes the selected action, action SS'3 in this case, is highlighted by a bold frame.

This stepwise detailed view of the test program may be extended to actions of increasingly higher order until the action highlighted in a subwindow is finally identical to the selected action.

To make the display more comprehensible, it is of course possible to display descriptive names that may be selected by a user, in particular names of portions of the test program corresponding to individual actions, in boxes 23 and 26 instead of numbers of the individual actions.

In the example system of the present invention, mouse 13 or another pointing device used in its place may also be used to highlight pairs of points in time on time scale 27 of a window 22, 25 or 29, the start or end of an action or the like and to have the time interval between the markings calculated by processor 11 and displayed. In this way, it is possible to measure time intervals between any selectable events; in particular the duration of individual actions or of groups of actions may be measured in order to compare them with an expected duration and thus locate program segments in need of optimization, or the success of an optimization action may be illustrated using the change in the time interval between identical events in different runs of the test program.

According to one enhancement of the present invention, in connection with each action that is concerned with the establishment or interruption of a connection between a signal generator and measuring unit 5 and a terminal 3, a record in the protocol is made concerning this connection and, if necessary, concerning a path of this connection within switching matrix 4. This enables processor 11 to determine, with respect to each stage of execution of the test program, which connections are active and on which paths they pass through the switching matrix. Having this information displayed makes a user conveniently able to determine if a shift of an action is compatible with the utilization of switching matrix 4.

Figure 2:
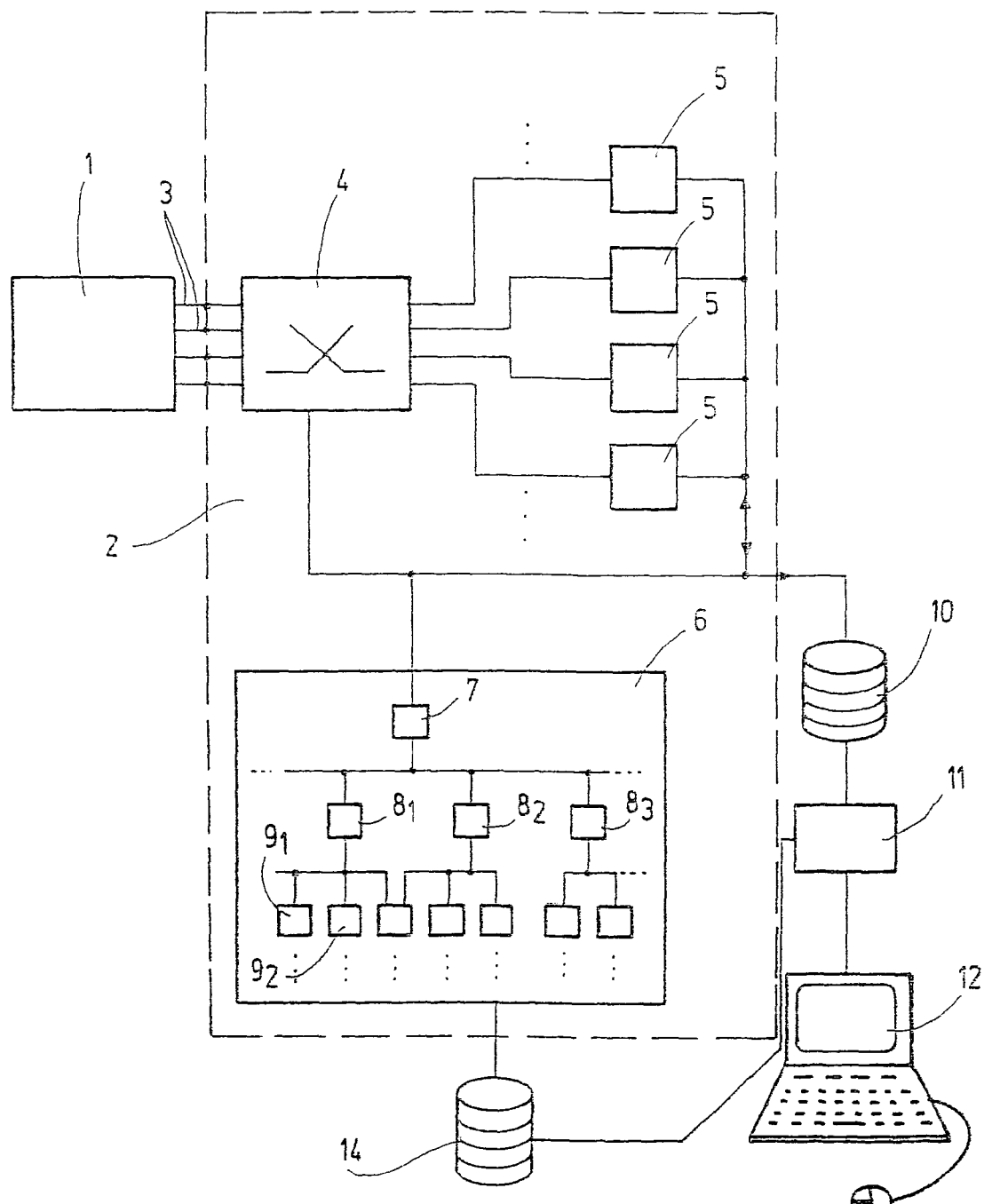
FIG. 2 shows a block diagram of a second example embodiment of the device.

A further refinement of the present invention is shown in FIG. 2 based on an idealized block diagram. In this example embodiment a second mass storage 14 is connected to control unit 6 and to processor 11. The test program is stored in second mass storage 14. Control unit 6 has read access, and processor 11 has read and write access to memory 14. If a user selects an action in the screen display of FIG. 2 or 3, processor 11 is able to identify a code segment corresponding to the action using the program address recorded in the protocol in connection with the relevant action and to display it on the terminal device and highlight it if necessary. The user is then able to make the changes in the displayed program segment, which processor 11 then saves in mass storage 14.

Second mass storage 14 and control unit 6 may be implemented within the same computer as components 10, 11 and 12. In this way, an integrated development environment is obtained which enables a user to find program segments needing optimization in a continuous process, to perform optimization of these program segments and to promptly use the test program thus optimized again on device 1.

What is claimed is:

1. A method of supporting an optimization of a test program made up of a plurality of actions, comprising:
    a) applying the test program to a device, wherein the test program has a hierarchical structure, the test program being made up of a sequence of first order actions and each action being either an elementary action or made up of several actions of a next higher order;
    b) recording a protocol having a plurality of entries, each of the entries corresponding to an action and each specifying at least a type of the action and a time the action is performed; and
    c) outputting a graphic representation of the sequence of the actions derived from the protocol;
    d) selecting, by a user, at least one type of action performed during the test program and at least one order of the actions performed during the test program; and
    e) highlighting at least one selected type of action performed during the test program, the output of the graphic representation including a representation of a sequence of actions of the at least one selected order while highlighting those actions which are or include an action of the at least one selected type.

2. The method as recited in claim 1, wherein the graphic representation is output on a screen.

3. The method as recited in claim 1, further comprising:
    selecting, by a user, one of the actions displayed in the graphic representation; and
    generating an additional graphic representation of those actions from which the selected action is made up.

4. The method as recited in claim 1, further comprising:
    recording a reference to a position in the test program corresponding to one of the actions in each protocol entry.

5. The method as recited in claim 4, further comprising:
    selecting, by a user, one of the actions in the graphic representation displaying the position corresponding to the action in the representation of the test program.

6. The method as recited claim 1, further comprising:
    recording, in the protocol, information concerning establishment or disconnection of all connections between a point of the device to be tested and an instrument.

7. The method as recited in claim 1, wherein the selected action establishes a connection of an instrument to a point of the device to be tested.

8. The method as recited in claim 1, wherein the selected action is a waiting condition of an instrument.

* * * * *